(12) United States Patent
Lachowicz et al.

(10) Patent No.: US 8,366,901 B2
(45) Date of Patent: Feb. 5, 2013

(54) DEPOSITION OF CONDUCTIVE POLYMER AND METALLIZATION OF NON-CONDUCTIVE SUBSTRATES

(75) Inventors: Agata Lachowicz, Erkrath (DE); Andreas Glöckner, Leverkusen (DE)

(73) Assignee: Enthone Inc., West Haven, CT (US)

( * ) Notice: Subject to any disclaimer, the term of this patent is extended or adjusted under 35 U.S.C. 154(b) by 700 days.

(21) Appl. No.: 12/440,355

(22) PCT Filed: Sep. 7, 2007

(86) PCT No.: PCT/IB2007/053617
§ 371 (c)(1),
(2), (4) Date: Mar. 25, 2009

(87) PCT Pub. No.: WO2008/029376
PCT Pub. Date: Mar. 13, 2008

(65) Prior Publication Data
US 2010/0012500 A1 Jan. 21, 2010

(30) Foreign Application Priority Data

Sep. 7, 2006 (EP) .................................. 06018728
Sep. 7, 2006 (EP) .................................. 06018729
Sep. 7, 2006 (EP) .................................. 06018730

(51) Int. Cl.
*C25D 5/54* (2006.01)
*C25D 5/56* (2006.01)
(52) U.S. Cl. ......... 205/159; 205/162; 205/164; 205/166
(58) Field of Classification Search .................. 205/159, 205/162, 164, 166
See application file for complete search history.

(56) References Cited

U.S. PATENT DOCUMENTS

| | | | |
|---|---|---|---|
| 3,642,588 A | | 2/1972 | Charrier |
| 3,684,666 A | | 8/1972 | Shaw et al. |
| 3,914,239 A | * | 10/1975 | Kuhnis et al. ................. 546/298 |
| 4,009,087 A | | 2/1977 | Kardos et al. |
| 4,547,270 A | | 10/1985 | Naarmann |
| 4,565,606 A | | 1/1986 | Cassat |
| 4,566,955 A | * | 1/1986 | Naarmann .................... 205/419 |
| 4,749,451 A | | 6/1988 | Naarmann |
| 5,183,552 A | * | 2/1993 | Bressel et al. ................ 205/158 |
| 5,194,313 A | | 3/1993 | Hupe et al. |
| 5,403,467 A | | 4/1995 | Jonas et al. |
| 5,578,188 A | * | 11/1996 | Mertens et al. ............... 205/334 |
| 5,597,471 A | | 1/1997 | Ragge et al. |
| 6,589,593 B1 | | 7/2003 | Hupe et al. |
| 7,025,867 B2 | | 4/2006 | Czeczka et al. |
| 7,071,289 B2 | * | 7/2006 | Sotzing ......................... 528/377 |
| 7,416,763 B2 | | 8/2008 | Kanda et al. |
| 2002/0110645 A1 | | 8/2002 | Shelnut et al. |
| 2003/0070934 A1 | | 4/2003 | Cobley et al. |
| 2004/0154926 A1 | | 8/2004 | Sun et al. |
| 2005/0016860 A1 | | 1/2005 | Radhakrishnan et al. |
| 2005/0039840 A1 | | 2/2005 | Foster et al. |
| 2005/0189231 A1 | * | 9/2005 | Capper et al. ................. 205/246 |
| 2006/0003579 A1 | * | 1/2006 | Sir ................................ 438/639 |
| 2010/0004423 A1 | | 1/2010 | Rieke |

FOREIGN PATENT DOCUMENTS

| | | |
|---|---|---|
| DE | 4138771 A1 | 5/1993 |
| DE | 4205190 A1 | 8/1993 |
| DE | 4227836 A1 | 5/1994 |
| DE | 10220684 A1 * | 11/2003 |
| DE | 60200891 T2 | 8/2005 |
| EP | 0206133 A1 | 12/1986 |
| EP | 0302590 A2 | 2/1989 |
| EP | 0477543 A2 | 4/1992 |
| EP | 1069210 A1 | 1/2001 |
| EP | 1092790 A2 | 4/2001 |
| EP | 1219729 A1 | 7/2002 |
| GB | 1034484 A | 6/1966 |
| GB | 2012307 A | 7/1979 |
| GB | 2013722 A | 8/1979 |
| JP | 5287582 A | 11/1993 |
| SU | 1528818 A1 | 12/1989 |
| WO | 0183854 A2 | 11/2001 |
| WO | 03012174 A1 | 2/2003 |
| WO | 2005066391 A1 | 7/2005 |

OTHER PUBLICATIONS

Cuprostar LP-1, "High Throw, Single Component Satin Acid Copper System" (no month, c. 2002) pp. 1-4.*
Envision DMS-E, "Direct Metallization System" (no month, c. 2002) Cookson Electronics PWB Materials & Chemistry, pp. 1-4.*
Cuprostar LP-1, "High Throw, Single Component Satin Acid Copper System" (no month, 2002) pp. 1-4.* Envision DMS-E, "Maximum Reliability in Direct Plating", Polyclad Technologies, pp. 1-82 (no date).*
International Search Report, PCT/IB2007/053617, dated Jun. 10, 2008, 7 pages.
Written Opinion, PCT/IB2007/053617, dated Jun. 10, 2008, 10 pages.
International Preliminary Report of Patentability, PCT/IB2007/053617, dated Mar. 10, 2009, 11 pages.

(Continued)

*Primary Examiner* — Edna Wong
(74) *Attorney, Agent, or Firm* — Senniger Powers LLP

(57) ABSTRACT

A process is provided for metallizing a surface of a substrate with electrolytically plated copper metallization, the process comprising electrolytically depositing copper over the electrically conductive polymer by immersing the substrate in an electrolytic composition and applying an external source of electrons, wherein the electrolytic composition comprises a source of copper ions and has a pH between about 0.5 and about 3.5. In another aspect, a process is provided for metallizing a surface of a dielectric substrate with electrolytically plated copper metallization, the process comprising immersing the substrate into a catalyst composition comprising a precursor for forming an electrically conductive polymer on the surface of the dielectric substrate and a source of Mn(II) ions in an amount sufficient to provide an initial concentration of Mn(II) ions of at least about 0.1 g/L to form an electrically conductive polymer on the surface of the dielectric substrate, and electrolytically depositing copper over said electrically conductive polymer.

17 Claims, No Drawings

OTHER PUBLICATIONS

European Search Report, EP06018728.3, Jun. 13, 2007, 4 pages.
European Search Report, EP06018729.1, Feb. 19, 2007, 3 pages.
European Search Report, EP06018730.9, Feb. 7, 2007, 4 pages.
Abstract of DE4205190; Aug. 26, 1993.
Abstract of DE4138771; May 27, 1993.
Abstract of DE10220684; Nov. 20, 2003.
Abstract of EP0206133; Dec. 30, 1986.

* cited by examiner

US 8,366,901 B2

DEPOSITION OF CONDUCTIVE POLYMER AND METALLIZATION OF NON-CONDUCTIVE SUBSTRATES

REFERENCE TO RELATED APPLICATIONS

This application is the U.S. national stage application of International Patent Application No. PCT/IB2007/053617, filed 7 Sep. 2007, and claims the benefit of European Applications Nos. 06018728.3, 06018729.1, and 06018730.9, filed 7 Sep. 2006, the entire disclosures of which are incorporated herein by reference.

FIELD OF THE INVENTION

The present invention generally relates to a process for metallizing the surface of a dielectric substrate, such as a process for metallizing the sidewalls of drilled through holes and microvias in dielectric substrates commonly used in PCB manufacture.

BACKGROUND OF THE INVENTION

The use of electrically conductive polymers in the metallization of a non-conductive polymeric resin substrate was disclosed by Hupe et al. (U.S. Pat. No. 5,194,313) for the metallization of epoxy resin substrates in PCB manufacture. The method described therein involved the oxidation of exposed surfaces of the polymeric resin substrate with an oxidizing agent, such as permanganate, followed by deposition of a conductive polymer from a catalyst solution comprising a polymerizable heterocyclic aromatic molecule and an acid. Exemplary heterocyclic aromatic molecules in the catalyst composition were pyrrole, furan, and thiophene. The heterocyclic aromatic molecules polymerize over the oxidized exposed surfaces of the polymeric resin substrate, and the deposited polypyrrole, polyfuran, or polythiophene rendered the exposed surfaces of the epoxy resin substrate electrically conductive and amenable to electrolytic copper plating. For example, the process was used to render electrically conductive the exposed side walls of drilled through holes in a copper clad laminate for subsequent copper plating. Advantageously, the oxidation step was selective for the exposed areas of epoxy resin, i.e., the sidewalls of the drilled through holes, and did not render copper laminate catalytic to polymerization.

Jonas et al. (U.S. Pat. No. 5,403,467) disclosed poly(3,4-ethylenedioxythiophene) (PEDOT), a specific conductive polymer for use in rendering polymeric resin substrates amenable to electrolytic copper plating.

As currently practiced, metallization of through holes and microvias in plastic substrates involves several steps: Drilling, conditioning, rinsing, oxidizing, rinsing, catalyzing, rinsing, and plating.

Although conventional processes (e.g., electroless copper, palladium, or graphite processes) are effective for copper plating epoxy resins of the type used in PCB manufacture, opportunities exist to optimize the process and the individual steps therein. For example, a need exists for a simpler process which uses fewer compositions, results in less solution waste, and has faster throughput.

SUMMARY OF THE INVENTION

Among the various aspects of this invention may be noted, therefore, an improved process for metallization of dielectric substrates in the manufacture of electronics.

Briefly, the invention is directed a process for metallizing a surface of a substrate with electrolytically plated copper metallization, the process comprising electrolytically depositing copper over the electrically conductive polymer by immersing the substrate in an electrolytic composition and applying an external source of electrons, wherein the electrolytic composition comprises a source of copper ions to provide a copper ion concentration between about 5 and about 135 g/L, preferably between about 5 g/L and about 70 g/L, and an acid, and has a pH between about 0.5 and about 3.5, preferably between about 1.5 and about 3.5.

In another aspect the invention is directed to a process for metallizing a surface of a dielectric substrate with electrolytically plated copper metallization, the process comprising immersing the substrate in a composition comprising a precursor for forming an electrically conductive polymer, a source of copper ions for electrolytic deposition, and an acid, to form an electrically conductive polymer on the surface of the dielectric substrate, and supplying an external source of electrons to electrolytically deposit copper over said electrically conductive polymer.

A further aspect of the invention involves a process for metallizing a surface of a dielectric substrate with electrolytically plated copper metallization, the process comprising immersing the substrate into a catalyst composition comprising a precursor for forming an electrically conductive polymer on the surface of the dielectric substrate and a source of Mn(II) ions in an amount sufficient to provide an initial concentration of Mn(II) ions of at least about 0.1 g/L, preferably at least about 0.85 g/L, to form an electrically conductive polymer on the surface of the dielectric substrate, and electrolytically depositing copper over said electrically conductive polymer.

Other objects and features of the invention will be in part apparent and in part pointed out hereinafter.

DETAILED DESCRIPTION OF THE EMBODIMENT(S) OF THE INVENTION

The present invention stems from the discovery of catalyst compositions and electrolytic copper plating compositions useful in metallization of exposed surfaces of dielectric substrates, such as the sidewalls of drilled through holes and microvias in polymeric resin substrates commonly used in PCB manufacture. Although the description of this invention focuses on metallizing the side walls of drilled through holes and microvias, the metallization process of the present invention is also applicable to metallizing dielectric substrates generally. For example, the metallization process can be used to metallize the surfaces of dielectric substrates in the manufacture of printed circuit boards, such as single or double copper laminated PCB substrates or multilayer copper laminated substrates.

The catalyst compositions and electrolytic copper plating compositions are characterized by chemistries different from, and often simpler than, those known in conventional metallization processes and are useful in metallization processes which employ fewer steps and higher current densities than conventional metallization processes. All of these attendant advantages yield a metallization process which results in less solution waste, higher throughput, and a high quality plated PCB product.

As described more fully below, among the aspects of the invention may be noted the provision of a catalyst composition comprising a precursor for forming an electrically conductive polymer, such as a polymerizable heterocyclic aromatic molecule, and a supplemental source of Mn(II) ions. In another aspect, a single solution may be used to both render a dielectric surface electrically conductive and to deposit copper metallization by electrolytic deposition. This solution combines the various components of both a catalyst composition comprising a polymerizable heterocyclic aromatic molecule and an electrolytic copper plating composition. This process advantageously uses fewer solutions and eliminates intermediate rinsing. In yet another aspect, a conductive polymer deposition and copper plating operation is provided which facilitate copper plating at a pH of on the order of, e.g., 2, which is about order of magnitude less acidic than conventional processes.

The metallization process of the present invention is applicable to any dielectric substrate material. Appropriate substrate materials for printed circuit boards include, for example, fiber reinforced epoxy resin substrates (i.e., layers of fibrous materials bonded together under heat and pressure with a thermosetting resin). In general, an epoxy resin substrate comprises a continuous-filament glass cloth bonded with an epoxy-resin system. Specific examples of epoxy resin substrates include the following: G-10, which is a substrate comprising epoxy resin reinforced with glass fiber cloth sheets; FR-4, which is a self-extinguishing substrate similar to G-10; G-11, which is a glass cloth and epoxy mixture; and FR-5, which is a flame-resistant version of G-11. FR-4 substrates can be reinforced with ceramic particles, such as those available from Rogers Corporation (Chandler, Ariz.). Other resins include polyphenylene ether, cyanate ester, and bismaleimide/triazine.

Additional dielectric materials which can be substrates for metallization include ceramics, glass, Teflon, glass fiber-reinforced Teflon, ceramic-reinforced Teflon, polystyrene, and polyimide (for flexible board applications).

In addition to the above-described materials, the substrate may comprise, for example, a semiconductor material such as silicon, $SiO_2$, or gallium arsenide, or an inorganic oxide such as alumina, titania, or zirconia.

To manufacture a PCB substrate, the dielectric substrates described above are laminated on one or both sides with copper foil by conventional processes. Commonly used laminates have an 18 μm thick copper clad. Multilayer circuit boards are formed by stacking up to 16 copper layers separated and supported by the above-described substrate materials. To form an electrical connection between copper layers, the PCB substrates are drilled with through holes (holes extending through the entire depth of the PCB or multilayer circuit board) and blind vias (holes which extend only part of the depth of the PCB or multilayer circuit board), such as by carbide bits and laser drilling. The drilled through holes and blind vias can be metallized using the metallization process of the present invention.

Alternatively, the metallization process of the present invention can be used to metallize the entire surface of bare dielectric substrates as used, for example, in sequential build up technology. After copper deposition/electrolytic plating using the process of the present invention, the PCB substrate may be drilled with through holes and blind vias, which may also be metallized using the metallization process of the present invention.

In yet another alternative, the metallization of drilled through holes and blind vias in a copper laminated PCB substrate can occur concurrently with the formation of a copper conducting pattern.

Holes through a PCB are typically drilled with carbide drill bits. When very small vias are required, the vias may be formed by lasers. Laser-drilled vias, called microvias, typically have an inferior surface finish inside the hole, which presents a challenge in their metallization. These holes are called microvias. The industry is moving toward microvias having diameters below 150 μm and which can be deeper than they are wide such that they have high aspect ratios. Aspect ratios are typically at least about 0.5:1, and in some cases greater than about 1:1. In this description, the aspect ratio is the ratio of the via depth to the width of the via opening. It is also possible with controlled-depth drilling, laser drilling, or by pre-drilling the individual sheets of the PCB before copper lamination, to produce holes that connect only some of the copper layers, rather than passing through the entire board. These holes are called blind vias when they connect an internal copper layer to an outer layer, or buried vias when they connect two or more internal copper layers. The walls of the through holes and blind vias can be metallized using the metallization process of the present invention.

The metallization process of the present invention can metallize dielectric substrates such as the glass fiber reinforced epoxy resin substrates commonly used in PCB manufacture. The process is applicable to plate the side wall of a drilled through hole or microvia with copper and can also be used to metallize the surface of bare dielectric substrates. In one embodiment, the steps for rendering a non-conductive substrate electrically conductive and amenable to electrolytic copper plating include:

1. Conditioning an exposed surface of a dielectric substrate (such as a side wall of a through hole or microvia) by exposing the substrate to a conditioning solution to render the exposed surface wettable.

2. Water rinse.

3. Oxidizing the conditioned exposed surface of the dielectric material in the through hole and microvia with a composition comprising an oxidant.

4. Water rinse.

5. Catalyzing the oxidized exposed surface with a catalyst solution comprising a polymerizable heterocylic aromatic molecule and an acid to deposit an electrically conductive polymer on the oxidized exposed surface of the dielectric material and thereby render that surface electrically conductive.

6. Water rinse.

The substrate can then be metallized by exposing the surfaces of the dielectric substrate having electrically conductive polymer thereon to an electrolytic copper plating bath comprising an anode and an electrolytic copper plating composition and applying an external source of electrons.

The conditioner solution in the above described metallization process can comprise the components described in German Patent Application DE4205190, which is incorporated by reference herein in its entirety. For example, the conditioner solution can contain at least 0.001% of a heterocyclic aromatic molecule comprising nitrogen, a crosslinker, and a pH buffering agent. Exemplary aromatic molecule comprising nitrogen include pyridine, quinoline, pyrrole, indole, acridine, isoquinoline, pyridazine, pyrimidine, quinoazoline, phenazine, cinnoline, pteridine, carbazole, pyrazole, imidazole, triazole, benzimidazole, purine, isoindole, derivatives thereof, and mixtures thereof. Exemplary conditioner solutions are available from Enthone Inc. (West Haven, Conn.) and include Envision® HDI Conditioner 7310, Envision® DMS-E Conditioner 7010, Envision® DMS-E Conditioner 7015, and Envision® DMS-E Conditioner 7310.

Exposing surfaces of dielectric materials to the conditioning solution conditions the surfaces for oxidation in the next step by rendering the surfaces wettable. Wetting the holes and vias before oxidation is advantageous for holes and vias having small diameters, which may be less than about 100 μm, or even less than about 50 µm, which are becoming increasingly common in drilled PCB substrates. The dielectric substrate can be exposed to the conditioner solution by any method such as flood, dip, or spray with the proviso that the exposure method adequately wets the exposed surfaces of the dielectric substrate, such as, for example, the sidewalls of through holes and microvias. Exposure is typically at temperatures between about 30° C. to about 65° C., such as between about 30° C. to about 50° C. or about 40° C. to about 65° C., for between about 1 and about 6 minutes, such as between about 2 to 5 minutes or about 1 to 3 minutes.

The initiator composition in the above described metallization process comprises an oxidant. The oxidant may be selected from known classes of oxidants such as manganese (VII) compounds, manganese(VI) compounds, iodine(VII) compounds, and cerium(IV) compounds. The above-described compounds are preferably oxygen compounds. For example, the oxidant may be selected from among permanganate, manganate, and periodate. A preferred oxidant is permanganate, which may be provided as the sodium or potassium salt. When permanganate is the oxidant in the initiator solution, exposure of the conditioned surfaces of the dielectric substrate oxidizes the surface of the exposed dielectric and yields a surface having a manganese(IV) oxide ($MnO_2$) film deposited thereon. This surface serves as an oxidant for polymerization. During subsequent polymerization, $MnO_2$ on the surface is consumed, and Mn(II) ions are formed. The density of the manganese(IV) oxide film is dependent upon factors such as oxidant concentration in the initiator solution, exposure time, and the manner of exposure. Typically, the concentration of permanganate in the initiator solution is between about 40 g/L and about 70 g/L, such as about 60 g/L. The initiator composition may contain additional wetting agents such as ionic or non-ionic fluoro-surfactants to improve the manganese(IV) oxide deposition.

Typically, the initiator composition comprises a buffer, usually boric acid, to buffer the composition to a pH between about 5 and about 7, more typically about 6. Phosphoric acid is used for pH adjustment during production. Initiator constituents are known in the art and are disclosed, for example, in DE 4113654, which is hereby incorporated by reference as if set forth in its entirety.

The conditioned surfaces of the polymeric resin substrate may be exposed to the initiator solution by any method such as flood, dip, or spray with the proviso that the exposure method is adequate to produce a manganese(IV) oxide film having a $MnO_2$ density on the conditioned surfaces between about 1 mg/dm$^2$ and about 10 mg/dm$^2$, such as between about 4 mg/dm$^2$ and about 6 mg/dm$^2$, on the exposed conditioned surfaces of the dielectric substrate. Exposure is typically at temperatures between about 80° C. to about 90° C. for between about 3 and about 6 minutes. Exemplary initiator solutions are available from Enthone Inc. (West Haven, Conn.) and include Envision® HDI Initiator 7320 and Envision® DMS-E Initiator 7020.

The catalyst solution in the above described metallization process comprises a precursor for forming an electrically conductive polymer, such as polymerizable heterocyclic aromatic molecule, and an acid. The film product deposited from the oxidant contained in the initiator solution, such as the manganese(IV) oxide deposited from an initiator solution comprising permanganate, and the acid catalyze the polymerization of the heterocyclic aromatic molecule on the oxidized surface of the polymeric resin substrate, forming an electrically conductive polymer thereon. The heterocyclic aromatic molecule may be derived from a cyclopentadiene (i.e, 5-membered ring with two double bonds) heterocyclic ring having the structure:

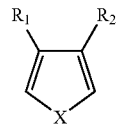

wherein:
X is selected from among O, S, and N; and
$R_1$ and $R_2$ are each independently selected from among hydrogen; a halogen; a substituted or unsubstituted alkyl group having from 1 to 8 carbon atoms, such as from 1 to 4 carbons; a substituted or unsubstituted alkoxy group having from 1 to 8 carbon atoms, such as from 1 to 4 carbon atoms. The substituted or unsubstituted alkoxy group is preferably bonded to the 5-membered heterocyclic ring by the oxygen atom. In one embodiment, $R_1$ and $R_2$ together with the atoms to which they are bonded form a five-membered ring or a six-membered ring. For example, a five-membered ring or a six-membered ring may be formed through a substituted or unsubstituted alkyl group having 3 or 4 carbon atoms or through a substituted or unsubstituted alkyldioxy group having 1 or 2 carbon atoms. Preferably, the substituted or unsubstituted alkyldioxy group is bonded to the 5-membered heterocyclic ring by the oxygen atoms. Preferably, the heterocyclic aromatic molecule can be a substituted or unsubstituted thiophene wherein X is sulfur, since polythiophenes exhibit good conductivity and processability. A preferred substituent is an unsubstituted ethylenedioxy group bonded to a 5-membered thiophene ring by the two oxygen atoms such that the structure comprises a fused ring system comprising a 5-membered thiophene ring and a 6-membered diether ring. This material, known as 3,4-ethylenedioxythiophene, polymerizes into poly(3,4-ethylenedioxythiophene), which is a preferred electrically conductive polymer because of its excellent conductivity.

The structure of the preferred 3,4-ethylenedioxythiophene is shown:

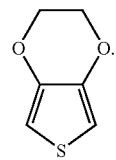

The catalyst composition may additionally comprise commercially available emulsifiers to enhance wetting and an acid. Acids suitable for inclusion in the catalyst composition include sulfuric acid, phosphoric acid, sulfonic acid, alkyl sulfonic acids, polymeric sulfonic acids (preferably polystyrene sulfonic acid), polyphosphoric acid, isethionic acid, sulfosuccinic acid, aryl sulfonic acids (e.g., p-toluene sulfonic acids), and salts thereof. The acid may be added in a concentration between about 0.1 g/L and about 50 g/L. The catalyst composition may be buffered to a suitable pH using buffering agents such as alkali metal salts of hydrogen phosphate, dihydrogen phophate, and acetate. Solvent suitable for use in the catalyst composition include methanol, ethanol, n-propanol, isopropanol, higher alcohols, polyalcohols, DMF (dimethyl formamide), ketones, more particularly methylethylketone, cumene sulfonate, N-methyl pyrrolidone, Triglyme, Diglyme, alkali metal salts of toluene sulfonates or their ethyl esters, aqueous alkaline solutions, or mixtures thereof.

Exposure of the oxidized surfaces of the dielectric substrate to the catalyst composition initiates a reaction between the $MnO_2$ film on the oxidized surface, the polymerizable heterocyclic aromatic molecule, and the acid which results in polymerization and deposition of an electrically conductive polymer on exposed oxidized surfaces of the dielectric substrate. Exposure can be by flooding, dipping, or spraying and typically occurs at room temperature or slightly below room temperature for between about 1 and about 8 minutes, such as between about 2 minutes and about 4 minutes. Exemplary catalyst solutions are available from Enthone Inc. (West Haven, Conn.) and include Envision® HDI Catalyst 7350 and Envision® DMS-E Catalyst 7050.

In one aspect of the invention, the catalyst composition comprises a supplemental source of Mn(II) ions. In conventional processes, the exposed surfaces of the dielectric substrate are oxidized, commonly with permanganate as described above. As permanganate oxidizes the surface, Mn(VII) ions are reduced to Mn(IV) ions, yielding a film of Mn(IV) oxide ($MnO_2$) on the surface of the dielectric substrate. As explained above, the Mn(IV) oxide ($MnO_2$) initiates polymerization of the polymerizable heterocyclic aromatic molecule, thus forming the electrically conductive polymer film on the surface. The polymerization reaction enriches the catalyst composition with Mn(II) ions. The Mn(II) ion concentration in a catalyst composition depends on the extent of its use in manufactured boards and the volume of solution. The following Mn(II) ion concentrations were measured in catalyst compositions obtained after normal PCB production at the end of their useful lives: (1) about 125 mg Mn(II) ion per liter after a throughput of 4.7 $m^2$ laminate/L using Envision® DMS-E Catalyst 7050 and (2) about 120 mg Mn(II) ion per liter after a throughput of 3.5 $m^2$ laminate/L using Envision® DMS-E Catalyst 7350. Freshly prepared solutions contain little if any Mn(II) ions.

Under production conditions, the useful catalyst composition life due to the accumulation of by-products is typically limited to about seven days or a throughput of about 5 $m^2$ laminate per liter. By-products form in the catalyst composition as the solution ages, which negatively influence the polymer conductivity and thus lateral copper growth. Usually the lateral copper growth drops under the required level of 2 mm/min after few days.

Applicants have discovered that by intentionally adding a supplemental source of Mn(II) ions to the catalyst composition the bath life is substantially improved. Polymer layers obtained from aged solutions containing supplemental Mn(II) ions are highly conductive compared to solutions without supplemental Mn(II) ions. Lateral copper growth is stabilized at high level of 2 mm/min over a useful composition life that has been extended to about 50 days by adding a supplemental source of Mn(II) ions to the catalyst composition as demonstrated in the below Examples. Preferably, the supplemental source of Mn(II) ions adds Mn(II) ions in a concentration of at least about 1 g/L, or at least about 2 g/L, such as between about 2 g/L and about 10 g/L. Adding at least about 0.1 g/L supplemental Mn(II) ions, preferably at least about 0.85 g/L, to the catalyst make-up is sufficient to improve lateral copper growth. Optimal stabilization may be achieved by adding supplemental Mn(II) ions at a concentration of about 3 g/L. Accordingly, the Mn(II) ion concentration in the catalyst bath is supplemented to yield an initial concentration of Mn(II) ions between about 0.1 g/L and about 30 g/L, such as between about 0.85 g/L and about 30 g/L, such as about 3 g/L. Sources of Mn(II) ion include soluble Manganese salts, e.g., manganese sulfate and manganese hypophosphite.

Exposure of the surface of the polymeric resin substrate to the catalyst composition which thereby yields an electrically conductive polymer deposited thereon is followed by a rinse step, which is followed by exposure to an electrolytic copper plating bath, the bath comprising an electrolytic copper plating composition and an anode. The electrolytic copper plating composition comprises a source of copper ions and an acid. The electrolytic copper composition may also comprise additives such as chloride ion, brighteners, inhibitors, and grain refiners, which are known in the art.

Sources of copper ions include copper sulfate, copper sulfate pentahydrate, copper oxide, copper carbonate, copper fluoroborate, copper pyrophosphate, copper cyanide, copper phosphonate, and other copper metal complexes such as copper methane sulfonate. In one embodiment, the copper source is one of the copper sulfate-based sources, namely, copper sulfate or copper sulfate pentahydrate. In another embodiment, the copper source is copper methane sulfonate. In embodiments wherein the copper source is a sulfate-based source, the concentration of copper typically ranges from about 5 g/L to about 75 g/L, such as between about 5 g/L and about 30 g/L or between about 30 g/L and about 75 g/L. Copper methanesulfonate is a more soluble source of copper, and the copper concentration may range more widely, such as from about 5 g/L to about 135 g/L, such as between about 75 g/L and about 135 g/L copper. In low copper systems, the copper ion concentration can be between about 5 g/L and about 30 g/L, such as between about 8 g/L to about 25 g/L. Exemplary low copper systems can comprise 8 g/L copper ions, 10 g/L copper ions, 20 g/L copper ions, or 25 g/L copper ions. In some high copper systems, the copper ion concentration can be between about 35 g/L and about 135 g/L, such as between about 35 g/L and about 75 g/L, preferably between about 35 g/L and about 60 g/L, or between about 75 g/L and about 135 g/L, preferably between about 100 g/L and about 135 g/L. In some high copper systems, the copper ion concentration can be between about 46 g/L and about 60 g/L, such as between about 48 g/L and about 52 g/L. In an exemplary high copper system, the copper ion concentration is about 40 g/L. In another exemplary high copper system, the copper ion concentration is about 50 g/L. In yet another exemplary high copper system, the copper ion concentration is about 75 g/L. In yet another exemplary high copper system, the copper ion concentration is about 135 g/L. To achieve a copper concentration of about 5 g/L, about 19 grams of copper sulfate pentahydrate is added per 1 L of solution. To achieve a copper concentration of about 75 g/L, about 292 grams of copper sulfate pentahydrate is added per 1 L of solution.

Chloride ion may also be used in the bath at a level up to 200 mg/L, such as between about 40 mg/L and about 200 mg/L or about 10 to 90 mg/L. Chloride ion is added in these concentration ranges to enhance the function of other bath additives. Typical sources of chloride ion include hydrochloric acid and alkali metal salts of chloride, most typically sodium chloride.

Other additives, which are known in the art, such as brighteners, inhibitors, and grain refiners can be added. Preferred electrolytic copper plating additives are the Cuprostar® LP-1 Additives available from Enthone Inc. (West Haven, Conn.), which may be added in a concentration between about 2 mL/L and about 8 mL/L, more preferably between about 3 mL/L and about 6 mL/L, such as about 4 mL/L or about 5 mL/L.

Sources of acid in the electrolytic plating bath include sulfuric acid, methane sulfonic acid, phosphoric acid, and certain polymer acids such as polystyrene sulfonic acid. Typically, in conventional electrolytic copper plating compositions, the acid can be present in a concentration between about 50 g/L and about 300 g/L, more typically between about 100 g/L and about 220 g/L, such as about 200 g/L.

In a preferred embodiment of the present invention, the concentration of acid is kept low, such as between about 0.1 g/L and about 30 g/L, more preferably between about 1 g/L and about 3 g/L to achieve a solution pH between about 0.5 and about 3.5, preferably between about 1.5 and about 3.5, more preferably between about 1.5 and about 2.5, such as about 2. For example, sulfuric acid can be added in a concentration of about 1 g/L to achieve a solution pH of about 2. Alternatively, in one preferred embodiment, a polymer acid, such as polystyrene sulfonic acid can be added in a concentration of about 2.5 g/L to achieve a solution pH of about 2. To achieve the pH of between about 0.5 and 3.5 in accordance with this invention, acid additions on the order of about 1 g/L are employed, such as between about 0.5 g/L and about 10 g/L, or between about 0.5 g/L and about 5 g/L. This is in contrast to conventional acid copper baths which employ at least 50 g/L acid, e.g., about 200 g/L sulfuric acid. The pH of conventional bath is usually not measured or is not measurable, so acidity is characterized in terms of g/L acid. This aspect of the invention applies to conventional plating over conductive substrates, as well as to plating over dielectric substrates treated with an electrically conductive polymer.

Applicants have discovered that, by plating with solutions having low acid concentration, uniform and adherent deposits can be obtained at higher current densities and higher voltages than using conventional plating baths. Substantially higher lateral copper growth on conductive polymer is achievable enabling surface metallization of bare dielectric substrates in the printed circuit manufacturing where common copper cladded laminates cannot be used, such as for example, the sequential build up technique.

A method of surface metallization of substrates coated with conductive polymer is described in U.S. Pat. No. 6,589,593 (Hupe et al.). This method requires additional treatment of the conductive polymer prior to electrolytic plating resulting in two additional process steps plus rinsing. With this method very high lateral copper growth of about 40 mm/min can be achieved in conventional copper plating compared to about 4 mm/min on untreated polymer with a normal resistance of about 2 to 5 kOhm/inch. By using electrolytic copper plating solutions having very low acid content, a lateral copper growth of about 40 mm/min is achievable on untreated polymer.

Applicants have discovered that plating at milder pH allows for an increase in the current density, which also increases throughput. For example, electrolytic copper plating at pH 2 allows plating a high quality copper deposit in laboratory equipment at current densities between about 5 A/dm$^2$ and about 10 A/dm$^2$. Comparable conventional, strongly acidic pH electrolytic baths can typically plate high quality deposits at current densities no greater than about 3 A/dm$^2$ when used in the same laboratory equipment.

In laboratory testing, wherein copper plating occurred in standard laboratory equipment, at current densities higher than approximately 3.5 A/dm$^2$ (and corresponding voltage higher than approximately 2 Volts), conventional copper baths decompose due to the formation of hydrogen on the cathode. By raising the composition pH to 2, which is at least an order of magnitude lower hydrogen ion concentration than conventional baths, a current density of about 10 A/dm$^2$ could be applied without hydrogen evolution and yielding a smooth, adhering copper deposit. The higher applicable current density/voltage is therefore a matter of the low acid content/high pH. In large scale copper plating, industrial equipment allows application of current densities up to 20 A/dm$^2$ (i.e., using a horizontal "push-plater") with conventional copper baths, such as between about 8 A/dm$^2$ and about 20 A/dm$^2$. In the preferred copper electrolytic plating with a composition pH 2, achievable current densities should be up to three times greater than the maximum current densities achievable in conventional, strongly acidic electrolytic copper plating baths.

Moreover, in laboratory testing, wherein copper plating occurred in standard laboratory equipment, smooth and uniform copper layers were obtained at voltages up to 10 V compared to 1-2 V with conventional copper baths. Higher voltage applied to conventional plating solution with high acid content yields a burnt and thereby unacceptable deposit. Through the higher applicable voltage accordingly higher deposition speed and higher lateral copper growth are achievable. The surface of substrates coated with conductive polymer can be entirely covered by copper at least three times faster.

In another embodiment of the process of the present invention, the catalyst solution additionally comprises a source of copper ions, and the rinse step occurring after exposure to the catalyst solution is eliminated. In this embodiment, components of the catalyst solution and components of the electrolytic copper plating composition are combined into a single composition. This composition is capable of both depositing an electrically conductive polymer on an exposed surface of dielectric substrate and depositing copper on the surface of the electrically conductive polymer with an applied current. This is not possible with normal copper baths because of the high acid concentration, which catalyzes polymerization and precipitation of the precursor monomer.

An exemplary catalyst solution/electrolytic copper plating composition comprises a polymerizable heterocyclic aromatic molecule, a source of copper ions, an acid, and other additives which are typically added to the electrolytic copper plating composition. The identities and the concentrations of the components of the catalyst solution/electrolytic copper plating composition are substantially the same as those described above in connection with the separate solutions.

Among the advantages of this combined solution and combined operation are the elimination of an intermediate rinse step, elimination of the need for separate catalysis and electrolytic plating vessels, and reduced overall process times.

In carrying out the process of the present invention, the compositions described above are used to deposit copper over the side walls of through holes and microvias of a single or double copper laminated PCB substrate or multilayer circuit board substrate. In one embodiment, the process of plating copper over the side walls of through holes and microvias comprises the following steps:

1. Drill through holes or microvias in a single or double copper laminated PCB substrate or multilayer circuit board substrate using carbide bit or laser drilling.

2. Condition the exposed surfaces of the through hole or microvia walls by exposing the substrate to Envision® DMS-E Conditioner 7015 (40 mL/L) for 3 minutes at 40° C.

3. Water rinse.

4. Oxidize the exposed conditioned surfaces (and simultaneously deposit Mn(IV)oxide) of the through hole or microvia walls by exposing the substrate to Envision®

DMS-E Initiator 7020 (60 g/L potassium permanganate and 10 g/L boric acid, pH 6) for 3 minutes at 80° C.

5. Water rinse.

6. Deposit electrically conductive polymer on the oxidized surfaces of the through hole or microvia walls by exposing the substrate to Envision® HDI Catalyst 7350A (15 mL/L, containing 3,4-ethylenedioxythiophene and emulsifier) and Envision® HDI Catalyst 7350B (45 mL/L, containing polystyrenesulfonic acid).

7. Water rinse.

8. Electrolytically plate copper over the electrically conductive polymer on the surfaces of the through hole or microvia walls by (a) exposing the substrate to an electrolytic plating bath comprising an anode and an electrolytic copper plating composition comprising copper sulfate pentahydrate (80 g/L), sulfuric acid (1 g/L to achieve pH 2), chloride ion (60 mg/L), and Cuprostar® LP-1 additives (5 mL/L), and (b) applying current (3 A, 5 minutes) to the substrate to deposit copper on the through holes walls and microvias.

Using the above-described method, a high quality copper deposit can be plated on through hole and microvia walls in a PCB or multilayer circuit board substrate. The above described process may also be used to plate a copper laminate on a bare dielectric substrate (i.e., a glass fiber reinforced epoxy resin substrate) having no pre-applied copper foil. Additionally, the above described process may also be used to plate a copper laminate over one or both sides and plate copper over the sidewalls of through holes and microvias of a bare dielectric substrate (i.e., a glass fiber reinforced epoxy resin substrate), which has been pre-drilled with through holes.

In another embodiment, the process of plating copper over the side walls of through holes and microvias comprises the following steps:

1. Drill through holes or microvias in a single or double copper laminated PCB substrate or multilayer circuit board substrate using carbide bit or laser drilling.

2. Condition the exposed surfaces of the through hole or microvia walls by exposing the substrate to Envision® DMS-E Conditioner 7015 (40 mL/L) for 3 minutes at 40° C.

3. Water rinse.

4. Oxidize the exposed conditioned surfaces of the through hole or microvia walls by exposing the substrate to Envision® DMS-E Initiator 7020 (60 g/L potassium permanganate and 10 g/L boric acid, pH 6) for 3 minutes at 80° C.

5. Water rinse.

6. Deposit electrically conductive polymer on the oxidized surfaces of the through hole or microvia walls by exposing the substrate to a catalyst solution/electrolytic plating composition comprising Envision® HDI Catalyst 7350A (15 mL/L, containing 3,4-ethylenedioxythiophene and emulsifier) and Envision® HDI Catalyst 7350B (15 mL/L, containing polystyrenesulfonic acid), copper sulfate pentahydrate (80 g/L), sulfuric acid (1 g/L to achieve pH 2), chloride ion (60 mg/L), and Cuprostar® LP-1 additives (5 mL/L) for 3 minutes.

7. Electrolytically plate copper on the surfaces of the through hole or microvia walls having conductive polymer thereon by applying current (1 to 2 A/dm$^2$, 5 minutes) to the substrate to deposit copper on the through holes walls and microvias.

Using the above-described method, a high quality copper deposit may be plated on through hole and microvia walls in a PCB or multilayer substrate.

In yet another embodiment, the process of the present invention may be used to plate copper over the walls of through holes and microvias in a PCB or multilayer substrate, which is further processed to yield a copper conducting pattern. The steps in this process are:

1. Drill holes through a glass fiber reinforced epoxy resin substrate which has been laminated on one or both sides with copper by a conventional process or by one of the processes described above.

2. Treat the drilled board with conditioner, initiator, and catalyst compositions to deposit an electrically conductive polymer film on sidewalls of the drilled through holes.

3. Apply a photo resist to the copper foil.

4. Apply a pattern mask in which the copper conducting pattern is dark and the rest of the mask is clear.

5. Irradiate the mask with ultraviolet light to render insoluble the photoresist material underneath the light areas which determine the copper conducting pattern.

6. Remove the pattern mask.

7. Apply alkaline developer which dissolves the not irradiated photoresist (soluble in developer, which contains usually sodium carbonate). In this case, a negative image is generated, so called additive technology. The photoresist is removed where the copper tracks will be formed. In the subsequent plating the copper is deposited in the "grooves" between irradiated resist and in the through-holes or microvias.

8. Electrolytically plate copper over the exposed pattern to a thickness of about 5 microns (also plates through holes) using the electrolytic copper plating bath at pH 2. For the subsequent plating to 25 microns (normal thickness), copper baths with high acid content, from about 200 g/L to about 250 g/L can be used.

9. Protect the copper conductor pattern with tin-lead or other resist material, which prevents oxidation and acts as a resist pattern.

10. Dissolve the remaining photoresist with solvent. (Typically in strongly alkaline solutions, as are commercially available.)

11. Dissolve the copper foil, exposing the resin substrate. The copper conducting pattern is not dissolved because it is protected by the resist.

12. Remove the metallic resist.

Accordingly, the process of the present invention may be used to selectively metallize exposed surfaces of a copper clad dielectric substrate, e.g. the sidewall of a through hole which has been drilled through the dielectric substrate, to establish an electrical connection between the copper laminate on one side of the epoxy-glass fiber substrate with the copper laminate on the other side of the epoxy-glass fiber substrate. The process may also be used to metallize the entire surface of a dielectric substrate.

The following examples further illustrate the present invention.

EXAMPLE 1

Electrolytic Copper Plating on PTH Test Coupon from Modified Electrolytic Cu Plating Composition Having pH 2

A PTH test coupon (FR-4 substrate, 5 cm×5 cm with 1.6 mm thickness, copper clad on both sides, drilled holes ranging from 0.2 to 0.8 mm in diameter in rows of 10 holes each) was treated in Envision® DMS-E Conditioner 7015 solution and Envision® DMS-E Initiator 7020 solution to oxidize the exposed surfaces of the dielectric substrate in the drilled through holes. Both solutions are available from Enthone Inc. (West Haven, Conn.). This was followed by treatment of the PTF test coupons in a catalyst solution to deposit a film of electrically conductive polymer on the oxidized surfaces in the drilled through holes. Conditioning, initiating, and catalysis parameters were as follows:
1. Dipped PTH test coupon in Envision® DMS-E Conditioner 7015 (1 Liter, concentration of 40 mL/L) for 3 minutes at 40° C. with stirring.
2. Rinsed coupon with water.
3. Dipped conditioned PTH test coupon in Envision® DMS-E Initiator 7020 (1 Liter, 60 g/L Potassium permanganate and 10 g/L boric acid) for 3 minutes at 80° C. with stirring.
4. Rinsed coupon with water.

The PTH test coupon was then pre-dipped in a solution comprising Envision® HDI Catalyst 7350A (100 mL/L, 3,4-ethylenedioxythiophene and emulsifier) for three minutes.

An electrolytic copper plating composition was prepared with composition pH 2 having the following components and approximate concentrations:
Envision® HDI Catalyst 7350B (about 50 mL/L, polystyrene sulfonic acid, sufficient to achieve pH 2)
$CuSO_4.5H_2O$ (100 g/L, Copper sulfate pentahydrate, provided approximately 25 g/L Cu(II) ion)
Cuprostar® LP-1 Additives (5 mL/L).

The treated PTH coupon was dipped in this electrolytic copper plating composition with no applied current for 3 minutes. Current was then applied to initiate copper deposition using copper anodes, and copper deposition occurred for 5 minutes. The applied current density was 1 $A/dm^2$. The coupons were then visually inspected for coverage. All through holes and edges of the coupon were completely covered by copper.

EXAMPLE 2

Electrolytic Copper Plating on DMS-E Standard Back Light Test Coupon from Modified Electrolytic Cu Plating Containing Catalyst Components A DMS-E standard back light test coupon with varying through hole sizes was treated in Envision® DMS-E Conditioner 7015 solution and Envision® DMS-E Initiator 7020 solution to oxidize the exposed surfaces of the dielectric substrate in the drilled through holes. Both solutions are available from Enthone Inc. (West Haven, Conn.). Conditioning and initiating parameters were as follows:
1. Dipped test coupon in Envision® DMS-E Conditioner 7015 (1 Liter, concentration of 40 mL/L) for 3 minutes at 40° C. with stirring.
2. Rinsed coupon with water.
3. Dipped conditioned test coupon in Envision® DMS-E Initiator 7020 (1 Liter, 60 g/L Potassium permanganate and 10 g/L boric acid) for 3 minutes at 80° C. with stirring.
4. Rinsed coupon with water.

An electrolytic copper plating composition was prepared having components of a catalyst solution and a copper plating solution. The composition had pH 1.8 and contained the following components and approximate concentrations:
Envision® HDI Catalyst 7350A (10 mL/L)
Envision® HDI Catalyst 7350B (about 12 mL/L, polystyrene sulfonic acid)
$CuSO_4.5H_2O$ (32 g/L Copper sulfate pentahydrate, provided approximately 8 g/L Cu(II) ion)
Cuprostar® LP-1 Additives (4 mL/L)
Phosphoric acid (about 1 g/L, sufficient to achieve pH 1.8).

The coupon was immersed into electrolytic copper plating bath for 3 minutes with no applied current. Current was then applied to the bath using a copper anode to initiate copper deposition, and copper deposition occurred for 5 minutes. The applied current density was about 1 $A/dm^2$. The coupons were then visually inspected for coverage. All through holes and edges of the coupon were completely covered by copper.

EXAMPLE 3

Electrolytic Copper Plating on DMS-E Standard Back Light Test Coupon from Modified Electrolytic Cu Plating Composition Containing Catalyst Components A DMS-E standard back light test coupon with varying through hole sizes was treated in Envision® DMS-E Conditioner 7015 solution and Envision® DMS-E Initiator 7020 solution to oxidize the exposed surfaces of the dielectric substrate in the drilled through holes. Both solutions are available from Enthone Inc. (West Haven, Conn.). This was followed by treatment of the test coupon in a catalyst solution to deposit a film of electrically conductive polymer on the oxidized surfaces in the drilled through holes. Conditioning, initiating, and catalysis parameters were as follows:
1. Dipped test coupon in Envision® DMS-E Conditioner 7015 (1 Liter, concentration of 40 mL/L) for 3 minutes at 40° C. with stirring.
2. Rinsed coupon with water.
3. Dipped conditioned test coupon in Envision® DMS-E Initiator 7020 (1 Liter, 60 g/L Potassium permanganate and 10 g/L boric acid) for 3 minutes at 80° C. with stirring.
4. Rinsed coupon with water.

An electrolytic copper plating composition was prepared having components of a catalyst solution and a copper plating solution. The composition had pH 2 and contained the following components and approximate concentrations:
Envision® HDI Catalyst 7350A (15 mL/L) Envision® HDI Catalyst 7350B (about 15 mL/L) $CuSO_4.5H_2O$ (40 g/L Copper sulfate pentahydrate, provided approximately 10 g/L Cu(II) ion)
Cuprostar® LP-1 Additives (4 mL/L)
Phosphoric acid (1 g/L).
Sulfuric acid (2 g/L, sufficient to yield a pH of about 1.5).

The coupon was immersed into electrolytic copper plating bath for 3 minutes with no applied current. Current was applied to the bath using an insoluble anode to initiate copper deposition, and copper deposition occurred for 5 minutes. The applied current density was 1.5 $A/dm^2$. The coupons were then visually inspected for coverage. All through holes and edges of the coupon were completely covered by copper.

EXAMPLE 4

Electrolytic Copper Plating on Test Board from Modified Electrolytic Cu Plating Composition Having pH 2

A test board (FR-4 substrate in which the copper clad was etched away except for a copper stripe of 1.0 cm, exposed area of dielectric 18 cm×10 cm) was treated in Envision® DMS-E Conditioner 7015 solution and Envision® DMS-E Initiator 7020 solution to oxidize the exposed surface of the dielectric substrate. Both solutions are available from Enthone Inc. (West Haven, Conn.). This was followed by treatment of the test board in a catalyst solution to deposit a film of electrically conductive polymer on the oxidized exposed dielectric surface. Conditioning, initiating, and catalysis parameters were as follows:
1. Dipped test board in Envision® DMS-E Conditioner 7015 (5 Liter, concentration of 40 mL/L) for 3 minutes at 40° C. with stirring.
2. Rinsed test board with water.
3. Dipped conditioned test board in Envision® DMS-E Initiator 7020 (5 Liter, 60 g/L Potassium permanganate and 10 g/L boric acid) for 3 minutes at 80° C. with stirring.
4. Rinsed coupon with water.
5. Dipped oxidized test board in catalyst composition (5 Liter) containing Envision® HDI Catalyst 7350A (10 mL/L, 3,4-ethylenedioxythiophene and emulsifier), and Envision® HDI Catalyst 7350B (10 mL/L, polystyrene sulfonic acid), and phosphoric acid to adjust pH to 2.0) for four minutes.
6. Rinsed coupon with water.

The polymer had a resistance of 4 kOhm per inch.

An electrolytic copper plating composition was prepared with composition pH 2 having the following components and approximate concentrations:
$H_2SO_4$ (about 1 g/L sulfuric acid, sufficient to achieve pH 2)
$CuSO_4.5H_2O$ (260 g/L, Copper sulfate pentahydrate, provided approximately 65 g/L Cu(II) ion)
Chloride ions (60 mg/L)
Cuprostar® LP-1 Additive (4 mL/L).

This bath was used to plate copper on the treated test board at constant voltage of 7.5 V for 7 minutes and 30 seconds. The surface coverage was 99% of a smooth uniform copper layer with a corresponding lateral copper growth of 24 mm/min. The bath employed a copper anode and was agitated using air agitation.

For comparison only 30% of the surface could be covered using a conventional copper bath in the same laboratory equipment. The test board was prepared at exactly the same conditions and electroplated with a conventional copper bath containing 20 g/L Cu(II) ions, 200 g/L sulfuric acid, 60 mg/L Chloride ions and 4 mL/L Cuprostar® LP-1 Additive at 1 V for 7 minutes and 30 seconds. Higher voltage resulted in non-uniform, partially burnt deposit.

EXAMPLE 5

Electrolytic Copper Plating on Test Board from Modified Electrolytic Cu Plating Composition Having pH 1.4

A test board (FR-4 substrate in which the copper clad was etched away except for a copper stripe of 1.0 cm, exposed area of dielectric 10 cm×10 cm) was treated as in example 5, steps 1 to 6. The test board was then electroplated in a solution having the following components and approximate concentrations:
Stannostar® A-135 Copper Concentrate (contains 135 g/L Cu(II) ions and approximately 40 g/L methanesulfonic acid), addition of 640 mL/L to a 1 Liter solution results in a Cu(II) ion concentration of about 85 g/L and methanesulfonic acid concentration of about 25 g/L and resulting pH of about 0.6)
Sodium hydroxide added to increase the pH to about 1.4
Chloride ions (60 mg/L)
Cuprostar® HMM Make-up (30 mL/L).

The test boards were plated at constant voltage of 5 V for 5 minutes. The dielectric surface was entirely covered by a smooth uniform copper layer. The calculated lateral copper growth was 20 mm/min.

For comparison, an identical copper bath having same formulation except for the added sodium hydroxide (unbuffered solution had a pH 0.6) the surface can be entirely coated at same plating conditions but the deposit is not uniform.

A conventional copper bath containing methanesulfonic acid (100 g/L), Stannostar® A-135 Copper Concentrate (640 mL/L), Chloride ions (60 mg/L), and Cuprostar® HMM Make-up (30 mL/L) yields, under the same plating conditions, partially copper covered boards with burnt, unacceptable copper deposit.

EXAMPLE 6

Electrolytic Copper Plating on Test Board from Modified Electrolytic Cu Plating Composition Having pH 1.5

A test board (FR-4 substrate in which the copper clad was etched away except for a copper stripe of 1.0 cm, exposed area of dielectric 10 cm×10 cm) was treated as in example 5, steps 1 to 6. The test board was then electroplated in a solution having the following components and approximate concentrations:
Stannostar® A-135 Copper Concentrate (contains 135 g/L Cu(II) ions and approximately 40 g/L methanesulfonic acid), addition of 640 mL/L to a 1 Liter solution results in a Cu(II) ion concentration of about 85 g/L and methanesulfonic acid concentration of about 25 g/L and resulting pH of about 0.6)
Sodium hydroxide added to increase the pH to about 1.5
Chloride ions (60 mg/L)
Cuprostar® HMM Make-up (30 mL/L)

The board was electroplated at 10 V for 2 minutes and 30 seconds. The surface was entirely covered by a smooth uniform copper deposit. The calculated lateral copper growth was 40 mm/min.

EXAMPLE 7

Electrolytic Copper Plating on Test Board from Modified Electrolytic Cu Plating Composition Having pH 1.4

A FR4 substrate (in which the copper clad was entirely etched away, 10×10 cm) was treated as follows to deposit conductive polymer:
1. Dipped test board in Envision® DMS-E Conditioner 7015 (concentration of 40 mL/L) for 3 minutes at 40° C. with stirring.
2. Rinsed test board with water.
3. Dipped conditioned test board in Envision® DMS-E Initiator 7020 (60 g/L Potassium permanganate and 10 g/L boric acid) for 3 minutes at 80° C. with stirring.
4. Rinsed coupon with water.
5. Dipped oxidized test board in catalyst composition containing Envision® HDI Catalyst 7350A (15 mL/L, 3,4-ethylenedioxythiophene and emulsifier), and Envision® HDI Catalyst 7350B (45 mL/L, polystyrene sulfonic acid) at room temperature for four minutes.
6. Rinsed coupon with water.
Polymer resistance: 3 kOhm per inch.

The substrate was electroplated in a copper bath as described in Example 6 at 2 V for 1 min to avoid initial polymer reduction at the contact, then at 10 V for 5 minutes.

The surface was entirely coated with a matte, uniform copper layer.

EXAMPLE 8

Electrolytic Copper Plating on Test Boards Rendered Electrically Conductive in Catalyst Composition Comprising Intentionally Added Mn(II) Ions Test boards (FR-4 substrate, having dimensions of 3 cm×10 cm, which is copper clad on both sides except for an area of 3 cm×5 cm in which the dielectric is exposed) were treated in Envision® DMS-E Conditioner 7015 solution and Envision® DMS-E Initiator 7020 solution to oxidize the exposed surface of the dielectric substrate. Both solutions are available from Enthone Inc. (West Haven, Conn.). Conditioning and initiating parameters were as follows:
1. Dipped test boards in Envision® DMS-E Conditioner 7015 (1 Liter, concentration of 40 mL/L) for 3 minutes at 45° C. with stirring.
2. Rinsed test boards with water.
3. Dipped conditioned test boards in Envision® DMS-E Initiator 7020 (1 Liter, 60 g/L Potassium permanganate and 10 g/L boric acid) for 3 minutes at 80° C. with stirring.
4. Rinsed test board with water.

This was followed by treatment of the test boards in a catalyst solution to deposit a film of electrically conductive polymer on the oxidized dielectric surface. Four catalyst solutions denoted A, B, C, and D were prepared each containing the following components:
Envision® HDI Catalyst 7350A (10 mL/L, 3,4-ethylenedioxythiophene and emulsifier)
Envision® HDI Catalyst 7350B (10 mL/L, polystyrene sulfonic acid)
Phosphoric acid to adjust pH to 2.0)
Water to 1 L.

Additionally, the four catalyst solutions contained intentionally added $Mn^{2+}$ ions in the following concentrations:
Solution A contained 0 g/L $Mn^{2+}$ ions.
Solution B contained 3 g/L $Mn^{2+}$ ions.
Solution C contained 6 g/L $Mn^{2+}$ ions.
Solution D contained 10 g/L $Mn^{2+}$ ions.

After the above described initiating and conditioning treatments, the test boards were treated in the above described catalyst solutions A, B, C, and D at room temperature for 4 minutes. Thereafter, the treated test boards with electrically conductive polymer deposited on the exposed dielectric surfaces were copper plated using Cuprostar® LP-1 electrolytic copper plating chemistry (available from Enthone Inc., West Haven, Conn.). Current was applied for 5 minutes at 2 A/dm².

The following table shows the lateral copper growth rate achievable from electrolytically plating copper on boards treated in the catalyst solutions A, B, C, and D when the solution was: (1) freshly made, (2) 6 days old, (3) 17 days old, and (4) 24 days old.

| Catalyst | Make-up | 6 days | 17 days | 24 days |
|---|---|---|---|---|
| A | 3.2 mm/min | 1.6 mm/min | 1.1 mm/min | 1.3 mm/min |
| B | 3.7 mm/min | 3.1 mm/min | 2.6 mm/min | 2.7 mm/min |
| C | 4.0 mm/min | 2.8 mm/min | 2.8 mm/min | 3.1 mm/min |
| D | 3.2 mm/min | 2.8 mm/min | 3.0 mm/min | 2.8 mm/min |

Intentional addition of Mn(II) ion to the catalyst solution maintained lateral copper growth fairly constant for up to 24 days. In contrast, lateral copper growth from catalyst solution A not containing intentionally added Mn(II) ion decreased substantially only six days after the solution's preparation.

EXAMPLE 9

Electrolytic Copper Plating on PTH Test Coupons Rendered Electrically Conductive in Catalyst Composition Comprising Intentionally Added Mn(II) Ions Test boards (FR-4 substrate, having dimensions of 3 cm×10 cm, which is copper clad on both sides except for an area of 3 cm×5 cm in which the dielectric is exposed) were treated in Envision® DMS-E Conditioner 7015 solution and Envision® DMS-E Initiator 7020 solution to oxidize the exposed surface of the dielectric substrate as described in Example 8, steps 1-4.

This was followed by treatment of the test boards in a catalyst solution to deposit a film of electrically conductive polymer on the oxidized dielectric surface. Five catalyst solutions denoted A, B, C, D and E were prepared each containing the following components:
Envision® HDI Catalyst 7350A (12 mL/L, 3,4-ethylenedioxythiophene and emulsifier)
Envision® HDI Catalyst 7350B (12 mL/L, polystyrene sulfonic acid)
Phosphoric acid to adjust pH to 2.0)
Water to 1 L.

Additionally, the catalyst solutions contained intentionally added Manganese sulfate hydrate, resulting in the following concentrations of $Mn^{2+}$ ions:
Solution A contained 0 g/L $Mn^{2+}$ ions.
Solution B contained 0.13 g/L $Mn^{2+}$ ions.
Solution C contained 0.42 g/L $Mn^{2+}$ ions.
Solution D contained 0.85 g/L $Mn^{2+}$ ions.
Solution E contained 2.6 g/L $Mn^{2+}$ ions.

After the above described initiating and conditioning treatments, the test boards were treated in the above described catalyst solutions A, B, C, D and E at room temperature for 4 minutes. Thereafter, the treated test boards with electrically conductive polymer deposited on the exposed dielectric surfaces were copper plated using Cuprostar® LP-1 electrolytic copper plating chemistry (available from Enthone Inc., West Haven, Conn.). Current was applied for 5 minutes at 2 A/dm². The solutions were tested over a period of 50 days after make-up. The following lateral copper growth was measured in dependence on solution age and Mn(II) ion concentration.

| Catalyst | Make-up | After 17 days | After 23 days | After 36 days | After 50 days |
|---|---|---|---|---|---|
| A | 3.3 mm/min | 1.95 mm/min | 1.8 mm/min | 1.5 mm/min | 0.5 mm/min |
| B | 3.2 mm/min | 2.4 mm/min | 1.85 mm/min | 1.4 mm/min | 1.1 mm/min |
| C | 3.5 mm/min | 2.0 mm/min | 1.9 mm/min | 2.1 mm/min | 1.3 mm/min |
| D | 3.3 mm/min | 2.1 mm/min | 2.0 mm/min | 2.3 mm/min | 1.9 mm/min |
| E | 3.6 mm/min | 2.5 mm/min | 2.9 mm/min | 2.9 mm/min | 2.4 mm/min |

The stability of lateral copper growth was improved by as little as 0.13 g/L added $Mn^{2+}$ ions. Moreover, further increases stability can be achieved by using higher Mn(II) ion concentration.

EXAMPLE 10

Electrolytic Copper Plating on Test Boards Rendered Electrically Conductive in Catalyst Composition Comprising Intentionally Added Mn(II) Ions Test boards (FR-4 substrate, having dimensions of 3 cm×10 cm, which is copper clad on both sides except for an area of 3 cm×5 cm in which the dielectric is exposed) were treated in Envision® DMS-E Conditioner 7015 solution and Envision® DMS-E Initiator 7020 solution to oxidize the exposed surface of the dielectric substrate as described in Example 8, steps 1-4.

This was followed by treatment of the test boards in a catalyst solution to deposit a film of electrically conductive polymer on the oxidized dielectric surface. Three catalyst solutions denoted A, B, and C were prepared each containing the following components:
  Envision® HDI Catalyst 7350A (15 mL/L, 3,4-ethylene-dioxythiophene and emulsifier)
  Envision® HDI Catalyst 7350B (50 mL/L, polystyrene sulfonic acid)
  Water to 1 L.

Additionally, the catalyst solutions contained intentionally added Manganese sulfate hydrate or Manganese hypophosphite hydrate resulting in following $Mn^{2+}$ content:
  Solution A without any additional component.
  Solution B contained 3 g/L $Mn^{2+}$ ions added as sulfate.
  Solution C contained 3 g/L $Mn^{2+}$ ions added as hypophosphite.

The boards were treated and electroplated as described in the previous example for lateral copper growth measurement. The catalyst solutions were tested directly after make-up and 10 days, 23 days, and 38 days after make-up.
Resistance of the conductive polymer measured prior to electroplating showed a better stabilization by Manganese hypophosphite than Manganese sulfate:

| Catalyst | Make-up | After 17 days | After 23 days | After 36 days |
|---|---|---|---|---|
| A | 4.5 kΩ/inch | 16 kΩ/inch | 50 kΩ/inch | 300 kΩ/inch |
| B | 4.0 kΩ/inch | 8 kΩ/inch | 13 kΩ/inch | 12 kΩ/inch |
| C | 4.5 kΩ/inch | 6 kΩ/inch | 11 kΩ/inch | 10 kΩ/inch |

The stabilizing effect was confirmed by corresponding lateral copper growth:

| Catalyst | Make-up | After 17 days | After 23 days | After 36 days |
|---|---|---|---|---|
| A | 5.5 mm/min | 1.9 mm/min | 0.5 mm/min | 0.4 mm/min |
| B | 5.1 mm/min | 2.8 mm/min | 3.0 mm/min | 3.2 mm/min |
| C | 5.4 mm/min | 4.0 mm/min | 3.5 mm/min | 4.4 mm/min |

When introducing elements of the present invention or the preferred embodiment(s) thereof, the articles "a", "an", "the" and "said" are intended to mean that there are one or more of the elements. For example, that the foregoing description and following claims refer to "an" interconnect means that there are one or more such interconnects. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense. The scope of invention is defined by the appended claims and modifications to the embodiments above may be made that do not depart from the scope of the invention.

We claim:

1. A process for metallizing a surface of a dielectric substrate with electrolytically plated copper metallization, the process comprising:
   contacting the dielectric substrate with an initiator composition comprising an oxidant to thereby form an oxide film on the surface of the dielectric substrate;
   contacting the surface of the dielectric substrate having the oxide film thereon with a catalyst composition comprising at least one heterocyclic aromatic molecule for forming an electrically conductive polymer on the oxide film on the surface of the dielectric substrate, an acid, and a source of Mn(II) ions in an amount sufficient to provide an initial concentration of Mn(II) ions of at least about 0.85 g/L to form an electrically conductive polymer on the oxide film on the surface of the dielectric substrate;
   contacting the surface of the dielectric substrate having the oxide film and electrically conductive polymer thereon with an electrolytic deposition composition comprising a source of copper ions and an acid; and
   supplying an external source of electrons to electrolytically depositing copper from said electrolytic deposition composition over said electrically conductive polymer.

2. The process of claim 1 wherein the source of Mn(II) ions is added in an amount sufficient to provide an initial concentration of Mn(II) ions of at least about 0.85 g/L and less than 30 g/L.

3. The process of claim 1 wherein the source of Mn(II) ions is added in an amount sufficient to provide an initial concentration of Mn(II) ions of at least about 2 g/L.

4. The process of claim 1 wherein the source of Mn(II) ions is added in an amount sufficient to provide an initial concentration of Mn(II) ions of between about 2 g/L and about 10 g/L.

5. The process of claim 1 wherein the source of Mn(II) ions is selected from the group consisting of $MnSO_4$, manganese hypophosphite, and a combination thereof.

6. The process of claim 1 wherein the catalyst composition further comprises a source of copper ions for said electrolytically depositing copper.

7. The process of claim 1 wherein the oxide film on the surface of the dielectric substrate and the acid in the catalyst composition initiate a reaction with the at least one heterocyclic aromatic molecule to thereby form the electrically conductive polymer.

8. The process of claim 1 wherein the initiator composition comprises permanganate in a concentration between about 40 and about 70 g/L as the oxidant, the oxide film on the surface of the dielectric substrate is a manganese (IV) oxide film, and said manganese(IV) oxide film on the dielectric substrate and the acid in the catalyst composition initiate a reaction with the at least one heterocyclic aromatic molecule to thereby form the electrically conductive polymer.

9. The process of claim 1 wherein the at least one heterocyclic aromatic molecule for forming the electrically conductive polymer is derived from a cyclopentadiene.

10. The process of claim 9 wherein the at least one heterocyclic aromatic molecule for forming the electrically conductive polymer has the structure:

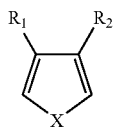

wherein:
X is selected from among O, S, and N; and
$R_1$ and $R_2$ are each independently selected from among hydrogen; a halogen; a substituted or unsubstituted alkyl group having from 1 to 8 carbon atoms; and a substituted or unsubstituted alkoxy group having from 1 to 8 carbon atoms.

11. The process of claim 1 wherein the at least one heterocyclic aromatic molecule for forming the electrically conductive polymer is 3,4-ethylenedioxythiophene represented by the formula:

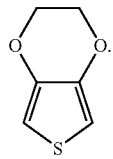

12. The process of claim 1 wherein the acid contained in said catalyst composition is selected from the group consisting of sulfuric acid, phosphoric acid, sulfonic acid, alkyl sulfonic acids, polymeric sulfonic acids, polystyrene sulfonic acid, polyphosphoric acid, isethionic acid, sulfosuccinic acid, p-toluene sulfonic acids, salts thereof, and combinations thereof.

13. The process of claim 1 wherein the catalyst composition further comprises a solvent selected from the group consisting of methanol, ethanol, n-propanol, isopropanol, higher alcohols, polyalcohols, DMF (dimethyl formamide), methylethylketone, cumene sulfonate, N-methyl pyrrolidone, Triglyme, Diglyme, alkali metal salts of toluene sulfonates or their ethyl esters, aqueous alkaline solutions, and combinations thereof.

14. The process of claim 1 wherein the external source of electrons is supplied at a current density between about 8 $A/dm^2$ and about 20 $A/dm^2$.

15. The process of claim 1 wherein the process is carried out in a horizontal way.

16. The process of claim 1 wherein the at least one heterocyclic aromatic molecule for forming the electrically conductive polymer has the structure:

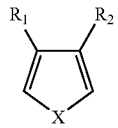

wherein:
X is selected from among O, S, and N; and
$R_1$ and $R_2$ together with the atoms to which they are bonded form a five-membered or six-membered ring.

17. The process of claim 16 wherein the five-membered or six-membered ring is formed through a substituted or unsubstituted alkyldioxy group having 1 or 2 carbon atoms.

* * * * *